(12) United States Patent
Huang et al.

(10) Patent No.: US 10,734,456 B2
(45) Date of Patent: Aug. 4, 2020

(54) DISPLAY PANEL AND MANUFACTURING METHOD THEREOF, AND DISPLAY APPARATUS

(71) Applicants: HEFEI XINSHENG OPTOELECTRONICS TECHNOLOGY CO., LTD., Hefei, Anhui (CN); BOE TECHNOLOGY GROUP CO., LTD., Beijing (CN)

(72) Inventors: Yongchao Huang, Beijing (CN); Dongfang Wang, Beijing (CN); Jun Cheng, Beijing (CN); Min He, Beijing (CN); Bin Zhou, Beijing (CN); Ce Zhao, Beijing (CN)

(73) Assignees: HEFEI XINSHENG OPTOELECTRONICS TECHNOLOGY CO., LTD., Hefei, Anhui (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/488,924

(22) PCT Filed: Jan. 31, 2019

(86) PCT No.: PCT/CN2019/074092
§ 371 (c)(1),
(2) Date: Aug. 26, 2019

(87) PCT Pub. No.: WO2019/223365
PCT Pub. Date: Nov. 28, 2019

(65) Prior Publication Data
US 2019/0371867 A1 Dec. 5, 2019

(30) Foreign Application Priority Data
May 21, 2018 (CN) .......................... 2018 1 0490262

(51) Int. Cl.
*H01L 27/32* (2006.01)
*H01L 51/56* (2006.01)

(52) U.S. Cl.
CPC .......... *H01L 27/322* (2013.01); *H01L 27/326* (2013.01); *H01L 27/3258* (2013.01); *H01L 51/56* (2013.01)

(58) Field of Classification Search
CPC . H01L 27/32; H01L 27/3225; H01L 27/3248; H01L 27/3272; H01L 27/3206;
(Continued)

(56) References Cited

U.S. PATENT DOCUMENTS

2015/0188095 A1   7/2015   Yoo et al.
2016/0322387 A1*  11/2016  Kim ................... H01L 27/1288
(Continued)

FOREIGN PATENT DOCUMENTS

CN   105810717 A   7/2016
CN   107068903 A   8/2017
(Continued)

OTHER PUBLICATIONS

Office Action of CN Application No. 201810490262.9 and translation, dated Mar. 19, 2020, 16 pages.

*Primary Examiner* — Thanh Y. Tran
(74) *Attorney, Agent, or Firm* — Muncy, Geissler, Olds & Lowe, P.C.

(57) ABSTRACT

A display panel, a method for manufacturing the display panel, and a display apparatus are provided. The display panel includes a base substrate; a thin film transistor; an OLED structure formed on the thin film transistor including a first and second electrodes arranged opposite to each other and an organic light emitting layer arranged between the first and second electrodes; a light shielding layer arranged between the first electrode and the organic light emitting
(Continued)

layer. The light shielding layer includes a first and a second light shielding layers. The first light shielding layer includes a first light shielding portion and a first opening portion corresponding to a pixel area. The second light shielding layer includes a second light shielding portion and a second opening portion corresponding to a pixel area. The second light shielding portion includes a first and second parts.

14 Claims, 3 Drawing Sheets

(58) Field of Classification Search
CPC ............... H01L 27/323; H01L 27/3258; H01L 27/3262; H01L 2227/32; H01L 27/326; H01L 27/3232
See application file for complete search history.

(56) References Cited

U.S. PATENT DOCUMENTS

| | | | |
|---|---|---|---|
| 2016/0329430 A1* | 11/2016 | Chung | ............ H01L 29/78606 |
| 2018/0033847 A1 | 2/2018 | Kim et al. | |
| 2018/0175130 A1* | 6/2018 | Kang | .................. H01L 51/5246 |
| 2019/0172885 A1* | 6/2019 | Lee | ..................... H01L 27/3272 |
| 2019/0172886 A1 | 6/2019 | Ma et al. | |

FOREIGN PATENT DOCUMENTS

| | | |
|---|---|---|
| CN | 107256872 A | 10/2017 |
| CN | 104752482 B | 11/2017 |
| CN | 107665906 A | 2/2018 |
| CN | 107978624 A | 5/2018 |
| CN | 107293554 A | 10/2018 |
| CN | 108766976 A | 11/2018 |

* cited by examiner

DISPLAY PANEL AND MANUFACTURING METHOD THEREOF, AND DISPLAY APPARATUS

CROSS-REFERENCE TO RELATED APPLICATION

This application is the U.S. national phase of PCT Application No. PCT/CN2019/074092 filed on Jan. 31, 2019, which claims priority to Chinese Patent Application No. 201810490262.9 filed on May 21, 2018, the disclosures of which are incorporated in their entirety by reference herein.

TECHNICAL FIELD

This disclosure relates to the field of manufacturing of liquid crystal products, and in particular, relates to a display panel, a manufacturing method of the display panel, and a display apparatus.

BACKGROUND

Illumination stability of Thin Film Transistor (TFT) is always a thorny issue. For Active Matrix/Organic Light Emitting Diode (AMOLED) products, illumination has an impact on the performance of the AMOLED panel.

SUMMARY

This disclosure provides a display panel, including: a base substrate; a plurality of gate lines and a plurality of data lines provided on the base substrate, where the plurality of gate lines and the plurality of data lines cross each other to define a plurality of pixel areas; a thin film transistor provided in each of the plurality of pixel areas; an Organic Light Emitting Diode (OLED) structure located on the thin film transistor, where the OLED structure includes a first electrode and a second electrode arranged opposite to each other and an organic light emitting layer arranged between the first electrode and the second electrode; and a light shielding layer, including a first light shielding layer arranged on a side of the first electrode away from the base substrate, and a second light shielding layer arranged on a side of the first light shielding layer away from the base substrate; where, the first light shielding layer includes a first light shielding portion and a first opening portion corresponding to one pixel area of the plurality of pixel areas; the second light shielding layer includes a second light shielding portion and a second opening portion corresponding to the pixel area; the second light shielding portion includes a first part and a second part, an area of an orthogonal projection of the first part on the base substrate is smaller than an area of an orthogonal projection of the first light shielding portion on the base substrate, and an orthogonal projection of the second part on the base substrate is located within an orthogonal projection of the first opening portion on the base substrate.

In some embodiments, the first light shielding portion and the second light shielding portion are of a same length in a direction in which the plurality of gate lines extends.

In some embodiments, the orthogonal projection of the first opening portion on the base substrate is of a same size and a same shape as an orthogonal projection of the second opening portion on the base substrate, and an orthogonal projection of the first light shielding layer on the base substrate is of a same size and a same shape as an orthogonal projection of the second light shielding layer on the base substrate.

In some embodiments, the first light shielding layer is made of a same material as the second light shielding layer.

In some embodiments, the first opening portion and the second opening portion form an opening and at least a part of the organic light emitting layer is located in the opening.

In some embodiments, the display panel further includes a color filter layer, where the color filter layer is provided between the thin film transistor and the first electrode, the color filter layer includes a pixel unit and the pixel unit is arranged corresponding to the pixel area.

In some embodiments, a planarization layer is provided between the first electrode and the color filter layer.

In some embodiments, the planarization layer is made of an organic material.

In some embodiments, an insulation layer is provided between the thin film transistor and the color filter layer.

In some embodiments, the insulation layer is made of an inorganic material.

This disclosure further provides a display apparatus, including the display panel above.

This disclosure further provides a method for manufacturing a display panel, including: forming a plurality of gate lines and a plurality of data lines on a base substrate, where the plurality of gate lines and the plurality of data lines cross each other to define a plurality of pixel areas; forming a thin film transistor in each of the plurality of pixel areas; forming an Organic Light Emitting Diode (OLED) structure on the thin film transistor, where the OLED structure includes a first electrode and a second electrode arranged opposite to each other and an organic light emitting layer arranged between the first electrode and the second electrode; forming a first light shielding layer on a side of the first electrode away from the base substrate, where the first light shielding layer includes a first light shielding portion and a first opening portion corresponding to one pixel area of the plurality of pixel areas; and forming a second light shielding layer on a side of the first light shielding layer that is distal to the base substrate, where the second light shielding layer includes a second light shielding portion and a second opening portion corresponding to the pixel area; where the second light shielding portion includes a first part and a second part, an area of an orthogonal projection of the first part on the base substrate is smaller than an area of an orthogonal projection of the first light shielding portion on the base substrate, and an orthogonal projection of the second part on the base substrate is located within an orthogonal projection of the first opening portion on the base substrate.

In some embodiments, the forming the first light shielding layer on the side of the first electrode away from the base substrate includes: forming, using a first mask, the first light shielding layer on the side of the first electrode away from the base substrate through an exposing and developing process; and the forming the second light shielding layer on the side of the first light shielding layer away from the base substrate includes: displacing the first mask to make a light transmission portion of the first mask to deviate from the first opening portion of the first light shielding layer; and forming the second light shielding layer through an exposing and developing process.

In some embodiments, after forming the thin film transistor in the pixel area, the method for manufacturing the display panel further includes: forming an insulation layer on one side of the thin film transistor away from the base substrate; and forming a color filter layer on one side of the insulation layer away from the base substrate, where a pixel unit of the color filter layer is arranged corresponding to the pixel area.

DETAILED DESCRIPTION

Figure 1:
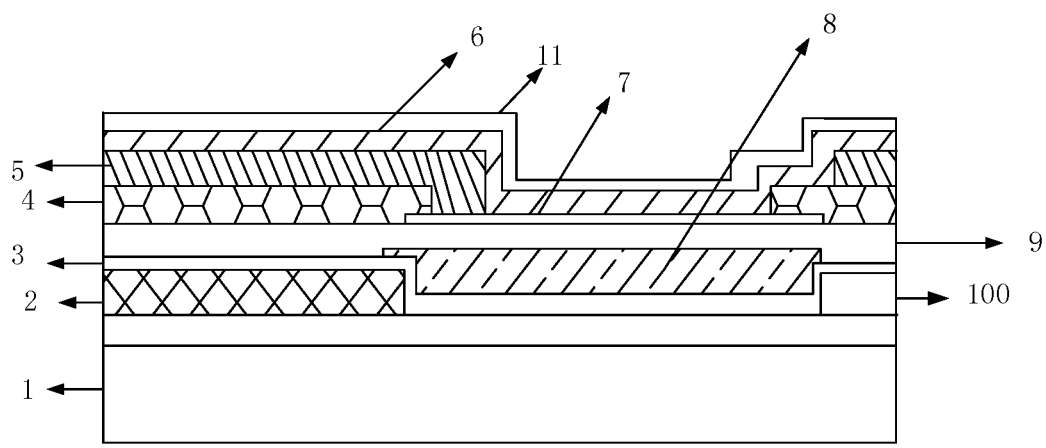
FIG. 1 is a schematic diagram of a display panel according to some embodiments of the present disclosure.

The features and principles of the present disclosure will be described hereinafter in detail in conjunction with drawings. The following embodiments are for illustrative purposes only, but shall not be used to limit the scope of the present disclosure.

In a display panel, a pixel light-emitting area is adjacent to a TFT in a direction in which gate lines extend, which leads to a light leakage in the horizontal direction of the pixel light-emitting area, thereby degrading the reliability of the TFT.

As shown in FIGS. 1-4, some embodiments provide a display panel, including a base substrate 1, a plurality of gate lines 10, a plurality of data lines 20, a plurality of thin film transistors 2, Organic Light Emitting Diode (OLED) structures and a light shielding layer.

The plurality of gate lines 10 and the plurality of data lines 20 each are located on one side of the base substrate 1, and the plurality of gate lines 10 and the plurality of data lines 20 cross each other to define a plurality of pixel areas.

Each of the plurality of pixel areas is provided with a thin film transistor 2, and the thin film transistor 2 is electrically connected to a corresponding gate line 10 and is electrically connected to a corresponding data line 20.

Each of the OLED structures is located on one side of the thin film transistor 2 away from the base substrate. Each of the OLED structures includes an organic light emitting layer 6, a first electrode 7 and a second electrode 11. The first electrode 7 and the second electrode 11 are arranged opposite to each other, and the organic light emitting layer 6 is arranged between the first electrode 7 and the second electrode 11.

The light shielding layer includes a first light shielding layer 4 arranged on one side of the first electrode 7 away from the base substrate 1, and a second light shielding layer 5 arranged on one side of the first light shielding layer 4 away from the base substrate 1.

At least a part of the first light shielding layer 4 is located on the side of the first electrode 7 away from the base substrate 1, and at least a part of the second light shielding layer 5 is located on the side of the first light shielding layer 4 away from the base substrate 1.

The first light shielding layer 4 includes a first light shielding portion 41 and a first opening portion 42 corresponding to the pixel area, and the second light shielding layer 5 includes a second light shielding portion and a second opening portion 53 corresponding to the pixel area.

Figure 3A:
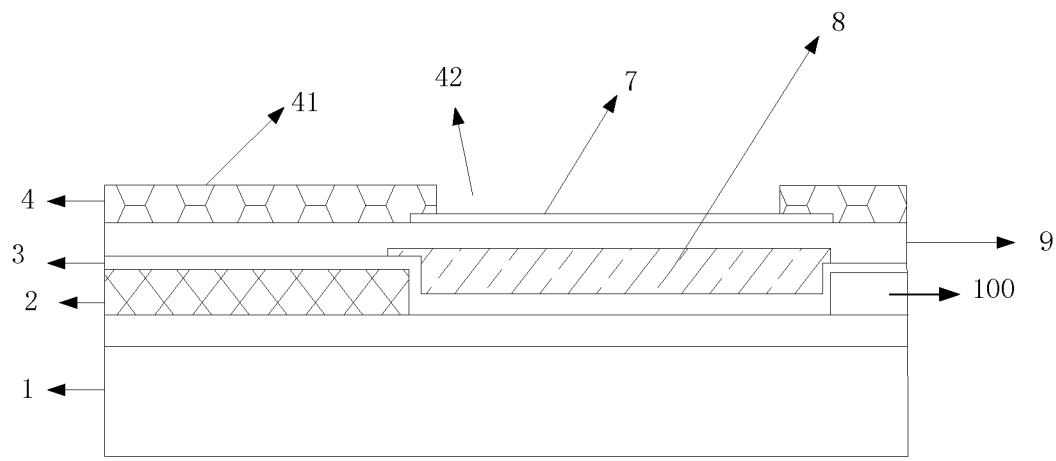
FIG. 3A is a schematic diagram of a part of the display panel according to some other embodiments of the present disclosure.
Figure 3B:
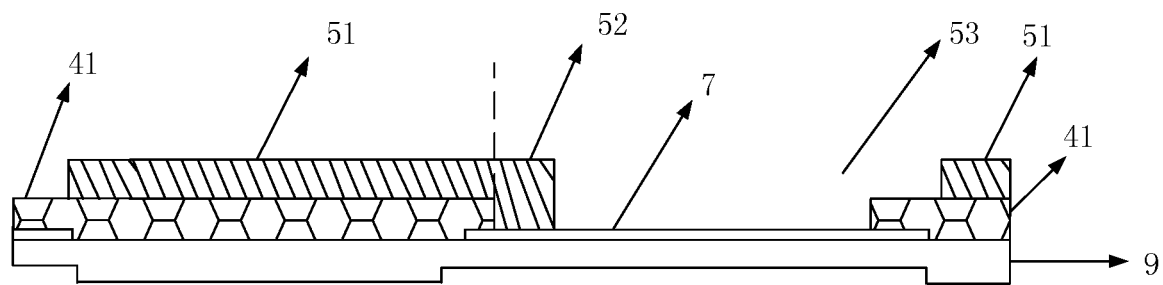
FIG. 3B is a schematic diagram of a part of the display panel according to some other embodiments of the present disclosure.

Referring to FIG. 3B, the second light shielding portion includes a first part 51 and a second part 52, and an area of an orthogonal projection of the first part 51 on the base substrate 1 is smaller than that of an orthogonal projection of the first light shielding portion 41 on the base substrate 1.

An orthogonal projection of the second part 52 on the base substrate 1 is located within an orthogonal projection of the first opening portion 42 on the base substrate 1.

Arrangement of the first light shielding layer and the second light shielding layer, a distance, in the direction in which the plurality of gate lines extends, between a portion of organic light emitting layer that corresponds to a pixel area and a thin film transistor is increased, reducing the light leakage in an area of the organic light emitting layer that corresponds to the pixel area in the direction in which the plurality of gate lines extends, thereby decreasing the impact of the light leakage on the thin film transistors and improving the reliability of the thin film transistor.

Figure 2:
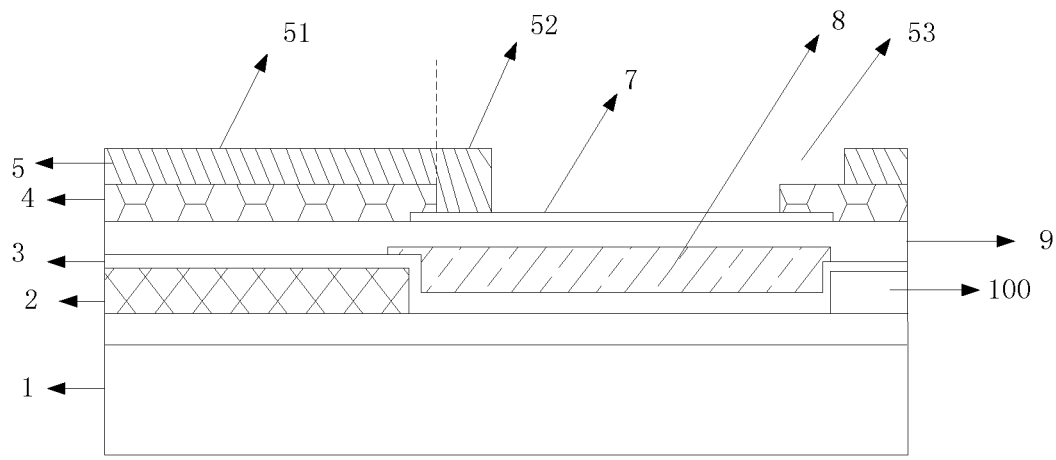
FIG. 2 is a schematic diagram of a part of the display panel according to some embodiments of the present disclosure.

As shown in FIG. 1 and FIG. 2, an area of the organic light emitting layer 6 that corresponds to the pixel area (an area of the organic light emitting layer 6 that corresponds to the second opening portion 53) is the pixel light-emitting area. At a side of each of the plurality of pixel areas, at which the thin film transistor 2 is electrically connected to a data line 20, an orthogonal projection of the second part 52 on the base substrate 1 extends out of an orthogonal projection of the first light shielding portion 41 on the base substrate 1, and the orthogonal projection of the second part 52 on the base substrate 1 is located within an orthogonal projection of the first electrode 7 on the base substrate 1.

Referring to FIG. 2, the second part 52 of the second light shielding portion is arranged on one side of the first electrode 7 away from the base substrate 1, and the first electrode 7 contacts the second part 52 of the second light shielding portion.

In comparison with the display panel in the related art provided with the first light shielding layer 4 only, the display panel according to the aforementioned embodiments has an increased distance, in the direction in which the gate lines 10 extend, between a pixel light-emitting area of each of the plurality of pixel areas and a thin film transistor 2, and the arrangement of the first light shielding portion 41 and the second light shielding portion reduces the light leakage in an area of the organic light emitting layer that corresponds to the pixel area in the direction in which the plurality of gate lines extends, thereby decreasing the impact of the light leakage on the thin film transistors and improving the reliability of the thin film transistor.

In the aforementioned embodiment, a source electrode 22 of the thin film transistor is electrically connected to a data line 20, and a drain electrode 23 of the thin film transistor is electrically connected to the first electrode (anode) 7, driving the display panel to display.

Figure 4:
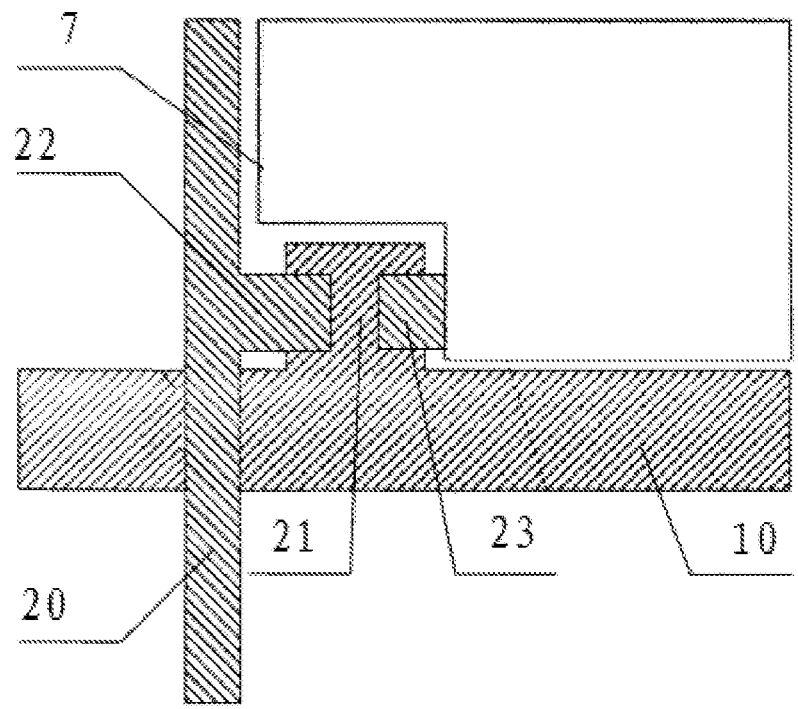
FIG. 4 is a schematic diagram of a thin film transistor according to some embodiments of the present disclosure.

FIG. 4 is merely a simple illustration of a situation in which a thin film transistor acts as a switching transistor to drive the display panel. It would be appreciated by a person skilled in the art that multiple thin film transistors collaborate to drive a display panel, e.g., AMOLED display panel, adapting a different technology, the multiple thin film transistors form a structure such as a 2T1C structure or a 3T1C structure. In these structures, the data lines 20 and the gate lines 10 are electrically connected to a first thin film transistor which is different from a second thin film transistor and the second thin film transistor respectively as long as driving the AMOLED display panel.

In some embodiments, the first light shielding portion 41 and the second light shielding portion 51 are of a same length in a direction in which the plurality of gate lines 10 extends.

The first light shielding portion 41 and the second light shielding portion 51 being of the same length in the direction in which the plurality of gate lines 10 extends allows for a translational displacement, in the direction in which the gate lines 10 extend, between the first light shielding layer 4 and the second light shielding layer 5, therefore reducing the process difficulty. In this way, in a process where a same mask is used to form both the first light shielding layer 4 and the second light shielding layer 5, the mask used for manufacturing the first light shielding layer 4 may be translated by a preset distance in the direction in which the plurality of gate lines 10 extends to form the second light shielding layer 5 on the first light shielding layer 4.

In some embodiments, the first light shielding layer 4 and the second light shielding layer 5 are formed using the same mask, an orthogonal projection of the first opening portion 42 on the base substrate 1 is of a same size and a same shape as an orthogonal projection of the second opening portion 53 on the base substrate 1, and an orthogonal projection of the first light shielding layer 4 on the base substrate 1 is of a same size and a same shape as an orthogonal projection of the second light shielding layer 5 on the base substrate 1.

In some embodiments, the first light shielding layer 4 is made of a same material as the second light shielding layer 5.

A variety of materials may be used to manufacture the first light shielding layer 4 and the second light shielding layer 5 as long as the materials may block light.

For example, the material of the first light shielding layer 4 and the second light shielding layer 5 may include: polyimide used as a material of pixel defining layer, polymer resin with a low transmittance such as black resin, or black matrix material.

In some embodiments, the first opening portion 42 and the second opening portion 53 form an opening, and at least a part of the organic light emitting layer 6 is located in the opening.

In some embodiments, the display panel further includes a color filter layer, the color filter layer is provided between the thin film transistor 2 and the first electrode 7, the color filter layer includes a pixel unit 8 and the pixel unit 8 is arranged corresponding to the pixel area.

In some embodiments, a projection of the pixel unit 8 on the pixel area completely covers the pixel area.

In some embodiments, a planarization layer 9 is provided between the first electrode 7 and the color filter layer.

In some embodiments, the planarization layer 9 is made of an organic material. In some embodiments, an insulation layer 3 is provided between the thin film transistor 2 and the color filter layer.

In some embodiments, the insulation layer 3 is made of an inorganic material.

In FIGS. 1-3A, the reference number 100 designates a wiring area on one side of the base substrate 1.

In some embodiments, a display apparatus including the display panel is provided.

Figure 5:
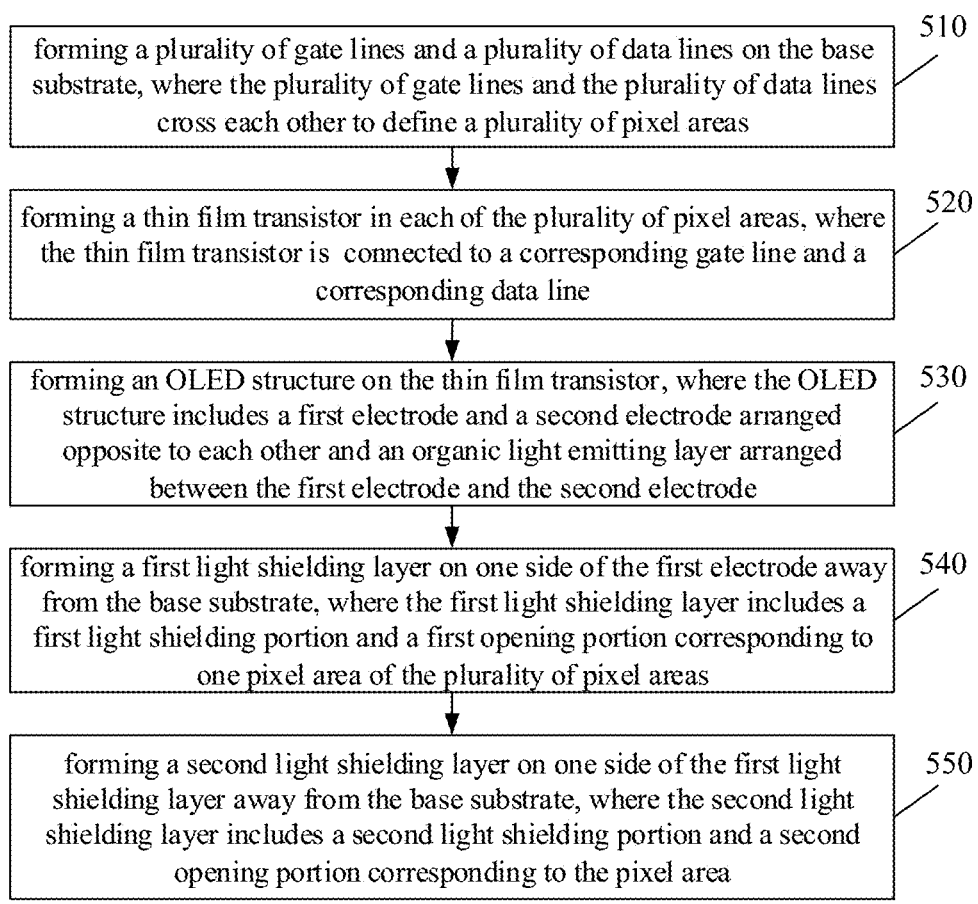
FIG. 5 is a flow chart of a method for manufacturing a display panel according to some embodiments of the present disclosure.

In some embodiments, a method for manufacturing a display panel is provided. As shown in FIG. 5, the method includes step 510 to step 550.

In step 510, a plurality of gate lines 10 and a plurality of data lines 20 are formed on a base substrate 1, where the plurality of gate lines 10 and the plurality of data lines 20 cross each other to define a plurality of pixel areas.

In step 520, a thin film transistor 2 in each of the plurality of pixel areas are formed, where the thin film transistor 2 is electrically connected to a corresponding gate line 10 and is electrically connected to a corresponding data line 20.

In step 530, an OLED structure is formed on the thin film transistor 2, where the OLED structure includes a first electrode 7 and a second electrode 11 arranged opposite to each other, and an organic light emitting layer 6 arranged between the first electrode 7 and the second electrode.

In step 540, a first light shielding layer 4 is formed on one side of the first electrode 7 away from the base substrate 1, where the first light shielding layer 4 includes a first light shielding portion 41 and a first opening portion 42 corresponding to the pixel area, as shown in FIG. 3A.

In step 550, a second light shielding layer 5 is formed on a side of the first light shielding layer 4 away from the base substrate 1, where the second light shielding layer 5 includes a second light shielding portion and a second opening portion 53 corresponding to the pixel area.

As shown in FIG. 3B, the second light shielding portion includes a first part 51 and a second part 52, an area of an orthogonal projection of the first part 51 on the base substrate 1 is smaller than that of an orthogonal projection of the first light shielding portion 41 on the base substrate 1.

An orthogonal projection of the second part 52 on the base substrate is located within an orthogonal projection of the first opening portion on the base substrate.

The portion of the organic light emitting layer 6 corresponding to the pixel area (the portion of the organic light emitting layer 6 corresponding to the second opening portion 53, that is, the portion of the organic light emitting layer 6 whose orthogonal projection on the base substrate 1 is located in the orthogonal projection of the second opening portion 53 on the base substrate 1) is the pixel light-emitting area. At a side of each of the plurality of pixel areas, at which the thin film transistor 2 is electrically connected to a data line 20, an orthogonal projection of the second part 52 on the base substrate 1 extends out of an orthogonal projection of the first light shielding portion 41 on the base substrate 1, and the second part 52 covers the first electrode 7. In comparison with the display panel in the related art provided with the first light shielding layer 4 only, the display panel according to the aforementioned embodiments has an increased distance, in the direction in which the plurality of gate lines 10 extends, between the pixel light-emitting area of each pixel area and a thin film transistor 2, and the arrangement of the first light shielding portion 41 and the second light shielding portion 51 reduce the light leakage in the pixel light-emitting area in the direction in which the gate lines 10 extend, thereby decreasing the impact of the light leakage on the thin film transistor and improving the reliability of the thin film transistor.

In some embodiments, manufacturing the first light shielding layer 4 and the second light shielding layer 5 with a same mask, and forming the first light shielding layer 4 on the side of the first electrode 7 away from the base substrate includes:

forming, using a first photomask, the first light shielding layer 4 on the side of the first electrode 7 away from the base substrate through an exposing and developing process; and forming the second light shielding layer 5 on the side of the first light shielding layer 4 away from base substrate.

In some embodiments, forming the second light shielding layer 5 on the first light shielding layer 4 includes: displacing the first mask to make a light transmission portion of the first mask to deviate from the first opening portion 42 of the first light shielding layer 4; and forming the second light shielding layer 5 through an exposing and developing process.

In some embodiments, after forming the thin film transistor in the pixel area, the method for manufacturing the display panel further includes: forming an insulation layer 3 on one side of the thin film transistor away from the base substrate 1; and forming a color filter layer on one side of the insulation layer 3 away from the base substrate 1, where a pixel unit 8 of the color filter layer is arranged corresponding to the pixel area.

The above descriptions are merely some embodiments of the present disclosure. A person skilled in the art may make further modifications and improvements without departing from the principle of the present disclosure.

What is claimed is:

1. A display panel, comprising:
   a base substrate;
   a plurality of gate lines and a plurality of data lines provided on the base substrate, wherein the plurality of gate lines and the plurality of data lines cross each other to define a plurality of pixel areas;
   a thin film transistor provided in each of the plurality of pixel areas;
   an Organic Light Emitting Diode (OLED) structure located on the thin film transistor, wherein the OLED structure comprises a first electrode and a second electrode arranged opposite to each other and an organic light emitting layer arranged between the first electrode and the second electrode; and
   a light shielding layer, comprising a first light shielding layer arranged on one side of the first electrode away from the base substrate, and a second light shielding layer arranged on one side of the first light shielding layer away from the base substrate;
   wherein the first light shielding layer comprises a first light shielding portion and a first opening portion corresponding to one pixel area of the plurality of pixel areas; the second light shielding layer comprises a second light shielding portion and a second opening portion corresponding to the pixel area;
   the second light shielding portion comprises a first part and a second part, an area of an orthogonal projection of the first part on the base substrate is smaller than that of an orthogonal projection of the first light shielding portion on the base substrate, and
   an orthogonal projection of the second part on the base substrate is located within an orthogonal projection of the first opening portion on the base substrate.

2. The display panel according to claim 1, wherein the first light shielding portion and the second light shielding portion are of a same length in a direction in which the plurality of gate lines extends.

3. The display panel according to claim 1, wherein the orthogonal projection of the first opening portion on the base substrate is of a same size and a same shape as an orthogonal projection of the second opening portion on the base substrate, and an orthogonal projection of the first light shielding layer on the base substrate is of a same size and a same shape as an orthogonal projection of the second light shielding layer on the base substrate.

4. The display panel according to claim 1, wherein the first light shielding layer is made of a same material as the second light shielding layer.

5. The display panel according to claim 1, wherein the first opening portion and the second opening portion form an opening and at least a part of the organic light emitting layer is located in the opening.

6. The display panel according to claim 1, further comprising a color filter layer, wherein the color filter layer is provided between the thin film transistor and the first electrode, and the color filter layer comprises a pixel unit arranged corresponding to the pixel area.

7. The display panel according to claim 6, wherein a planarization layer is provided between the first electrode and the color filter layer.

8. The display panel according to claim 7, wherein the planarization layer is made of an organic material.

9. The display panel according to claim 6, wherein an insulation layer is provided between the thin film transistor and the color filter layer.

10. The display panel according to claim 9, wherein the insulation layer is made of an inorganic material.

11. A display apparatus, comprising the display panel according to claim 1.

12. A method for manufacturing a display panel, comprising:
    forming a plurality of gate lines and a plurality of data lines on a base substrate, wherein the plurality of gate lines and the plurality of data lines cross each other to define a plurality of pixel areas;
    forming a thin film transistor in each of the plurality of pixel areas;
    forming an Organic Light Emitting Diode (OLED) structure on the thin film transistor, wherein the OLED structure comprises a first electrode and a second electrode arranged opposite to each other, and an organic light emitting layer arranged between the first electrode and the second electrode;
    forming a first light shielding layer on one side of the first electrode away from the base substrate, wherein the first light shielding layer comprises a first light shielding portion and a first opening portion corresponding to one pixel area of the plurality of pixel areas; and
    forming a second light shielding layer on one side of the first light shielding layer away from the base substrate, wherein the second light shielding layer comprises a second light shielding portion and a second opening portion corresponding to the pixel area;
    wherein the second light shielding portion comprises a first part and a second part, an area of an orthogonal projection of the first part on the base substrate is smaller than that of an orthogonal projection of the first light shielding portion on the base substrate; and
    an orthogonal projection of the second part on the base substrate is located within an orthogonal projection of the first opening portion on the base substrate.

13. The method for manufacturing the display panel according to claim 12, wherein the forming the first light shielding layer on the side of the first electrode away from the base substrate comprises:
    forming, using a first mask, the first light shielding layer on the side of the first electrode away from the base substrate through an exposing and developing process; and
    the forming the second light shielding layer on the side of the first light shielding layer away from the base substrate comprises:

displacing the first mask to make a light transmission portion of the first mask to deviate from the first opening portion of the first light shielding layer; and forming the second light shielding layer through an exposing and developing process.

14. The method for manufacturing the display panel according to claim 12, further comprising: after forming the thin film transistor in the pixel area of the plurality of pixel areas, forming an insulation layer on one side of the thin film transistor away from the base substrate; and forming a color filter layer on one side of the insulation layer away from the base substrate, wherein a pixel unit comprised by the color filter layer is arranged corresponding to the pixel area.

* * * * *